United States Patent [19]
Wilkinson

[11] 3,936,773
[45] Feb. 3, 1976

[54] TWO-PHASE QUADRATURE VOLTAGE-CONTROLLED SINE-WAVE OSCILLATOR

[75] Inventor: Bruce L. Wilkinson, Torrance, Calif.

[73] Assignee: Taylor C. Fletcher, Long Beach, Calif.

[22] Filed: Oct. 17, 1974

[21] Appl. No.: 515,499

[52] U.S. Cl........... 331/135; 331/108 D; 331/177 R
[51] Int. Cl.².......................................... H03B 5/20
[58] Field of Search.... 331/135, 136, 177 R, 108 D, 331/177 V

[56] References Cited
UNITED STATES PATENTS
3,482,188  12/1969  Crouse....................... 331/177 R X
3,826,999  7/1974  Williford..................... 331/135 X Primary Examiner—Siegfried H. Grimm
Attorney, Agent, or Firm—Keith D. Beecher

[57] ABSTRACT

A voltage controlled sine wave oscillator is provided in which the frequency of the output signal is a linear function of the amplitude of an input control signal. The output signal may be of constant amplitude with changes in frequency, or its amplitude may be a linear function of its frequency. Two-phase quadrature output signals may be provided for multi-phase applications. The oscillator of the invention in the embodiment to be described herein is solid state, and it makes use of operational integrators, analog multipliers, and associated circuitry to generate the outputs.

6 Claims, 2 Drawing Figures

TWO-PHASE QUADRATURE VOLTAGE-CONTROLLED SINE-WAVE OSCILLATOR

BACKGROUND OF THE INVENTION

The output of the oscillator in the embodiment of the invention to be described has a low distortion sinusoidal waveform, and the frequency of the output is controlled by a direct-current input signal. The oscillator is capable of generating two output signals displaced 90° in phase from one another. The ability of the oscillator to produce two-phase quadrature output signals makes it useful for polyphase applications, as mentioned above. For example, by combining the two output signals, an output signal of any desired phase displacement may be synthesized.

The oscillator of the invention is particularly, though not exclusively, useful for supplying reference signals to multiphase alternating-current induction motor speed controls. Its other applications include, for example, telemetry systems, frequency synthesizers, phase-lock loop communication detector circuits, and the like.

DETAILED DESCRIPTION OF THE ILLUSTRATED EMBODIMENT

Figure 1:
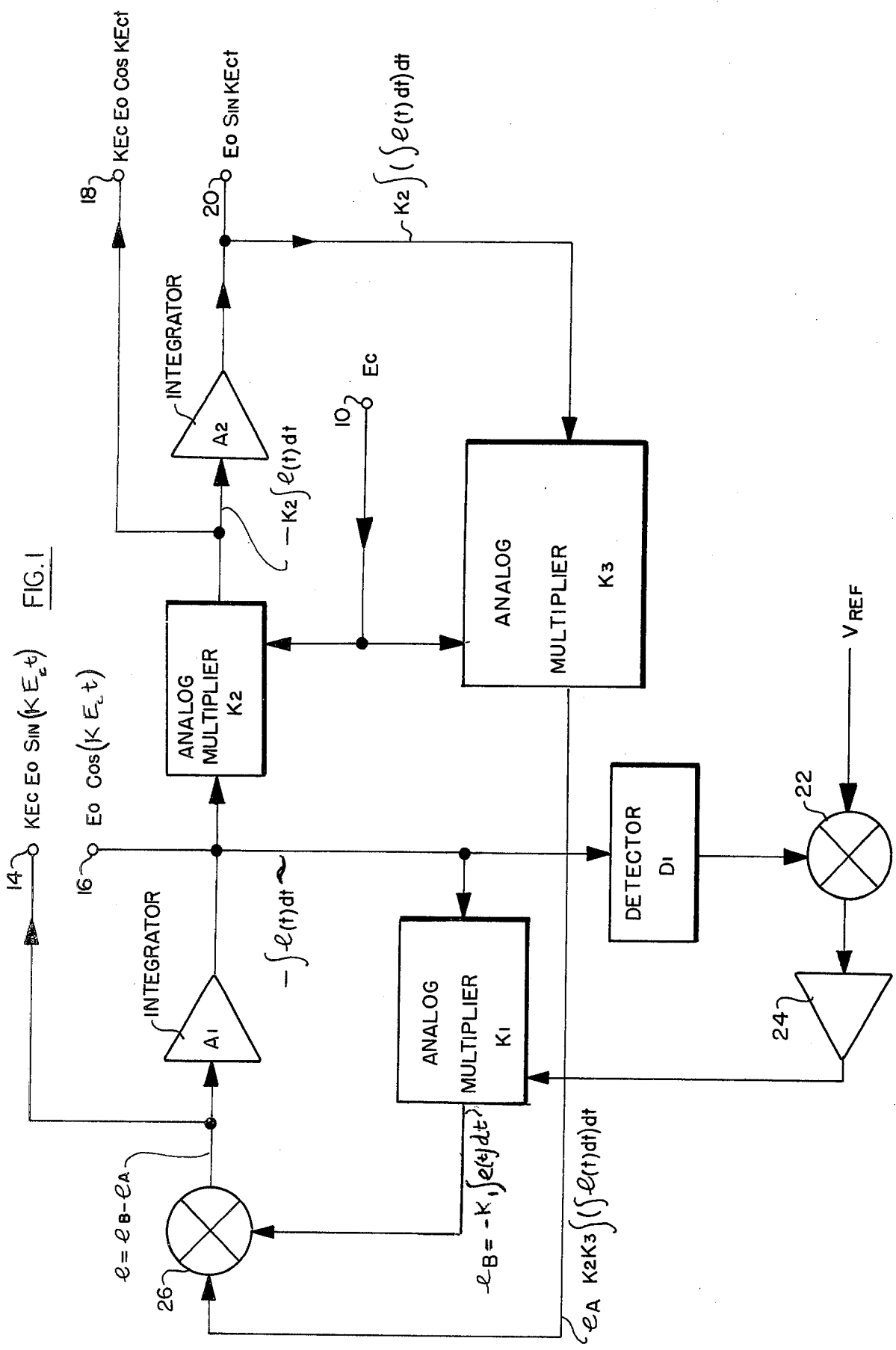
FIG. 1 is a block diagram of a voltage controlled continuous wave oscillator constructed in accordance with the invention.

The oscillator circuit shown in FIG. 1 includes an input terminal 10 to which may be applied a control voltage input $E_c$. Changes in the control voltage input produce corresponding changes in the frequency of the output signals of the oscillator in a direct proportional relationship.

The input terminal 10 is connected to a pair of analog multipliers $K_2$ and $K_3$. The analog multipier $K_3$ is connected through a summing network 26 to an operational integrator designated $A_1$. The summing network is also connected to an output terminal 14 at which an output $KE_cE_0\sin KE_ct$ appears. The frequency of this output signal is directly proportional to the input voltage $E_c$, and its amplitude is directly proportional to its frequency.

The output of the operational integrator $A_1$ is connected to the analog multiplier $K_2$, and also to an output terminal 16. An output signal $E_0\cos KE_ct$ appears at the output terminal 16. This signal has a constant amplitude for changes in frequency, and its frequency is directly proportional to the voltage $E_c$ applied to the input terminal 10. The output of the analog multiplier $K_2$ is connected to an operational integrator $A_2$ and to an output terminal 18. An output signal $KE_cE_0\cos KE_ct$ appears at the output terminal 18 which has a frequency directly proportional to the control voltage $E_c$ applied to the input terminal 10, and which has an amplitude which varies in direct proportion to variations in the frequency.

The output of the operational integrator $A_2$ is connected to an output terminal 20 and to the input of the analog multiplier $K_3$. An output signal $E_0\sin KE_ct$ appears at the output terminal 20. This output signal has a frequency which varies in direct proportion to the voltage $E_c$ applied to the input terminal 10, and it has an amplitude which remains constant for changes in frequency.

The output of the analog multiplier $K_3$ is connected to the summing network 26. The output of the operational integrator $A_1$ is also connected to an analog multiplier $K_1$, the output of which is also connected to the summing network 26. The output of the operational integrator $A_1$ is also connected to a detector $D_1$ which, in turn, is connected to a summing network 22. A reference voltage $V_{ref}$ is also applied to the summing network 22, and the network is connected through an amplifier 24 to the analog multiplier $K_1$.

Figure 2:
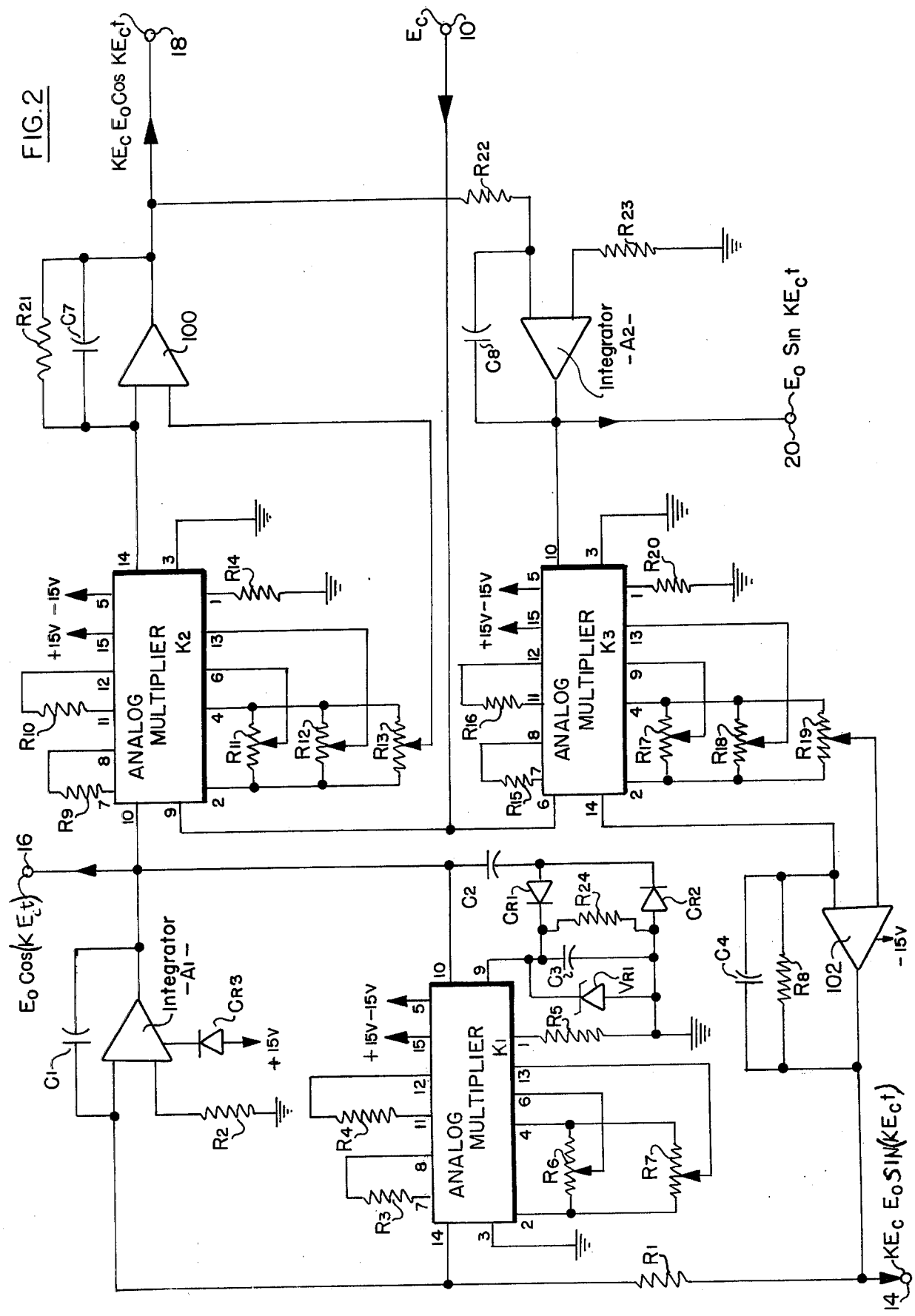
FIG. 2 is a more detailed circuit diagram of the oscillator of FIG. 1.

The analog multipliers $K_1$, $K_2$ and $K_3$, and the analog integrators $A_1$ and $A_2$ are commercially available integrated circuits. For example, the analog multipliers $K_1$, $K_2$ and $K_3$ may each take the form of an integrated circuit of the type presently designated MC1494. The integrators $A_1$ and $A_2$ may be operational amplifiers, each having a negative feedback path formed by a capacitor, as shown in FIG. 2.

The output of the integrator $A_1$ may be designated $-\int e(t)dt$; the output of the analog multiplier $K_2$ may be designated $-K_2\int e(t)dt$; the output of the integrator $A_2$ may be designated $K_2\int(\int e(t)dt)dt$; the output of the analog multiplier $K_1$ may be designated $-K_1\int e(t)dt$; the output of the analog multiplier $K_3$ may be designated $K_2K_3\int(\int e(t)dt)dt$.

The output ($e$) of the summing network 26 is equal to $e_B - e_A$, i.e., $$e = -K_1\int e\, dt - K_2K_3\int(\int e\, dt)\, dt \qquad (1)$$

Differentiating twice and collecting terms:

$$\frac{d^2e}{dt} + K_1\frac{de}{dt} + K_2K_3 e = 0 \qquad (2)$$

The general solution of $e(t)$ is:

$$e(t) = A_0 e^{-K_1 t}\sin(\sqrt{K_2K_3} + \theta) \qquad (3)$$

Where: $A_0$ and $\theta$ are arbitrary constants.

For a continuous wave, the value of $\theta$ may be assumed to be 0. The amplitude of the output is controlled by varying $K_1$, i.e., for a positive $K_1$ the amplitude decreases; for a negative $K_1$ the amplitude increases; and when $K_1$ is zero, the amplitude is constant.

The detector $D_1$ detects the amplitude of the output ($-\int e(t)dt$) of integrator $A_1$, and the output of detector $D_1$ is compared with the reference voltage $V_{ref}$ in summing network 22. The summing network 22 produces a signal which is proportional to the difference between the output of detector $D_1$ and the reference voltage $V_{ref}$. The output from the summing network is amplified by amplifier 24 and fed to the multiplier $K_1$. The sense of the latter signal is selected so that for an output from detector $D_1$ greater than the reference voltage $V_{ref}$, the constant $K_1$ is positive, and for an output from detector $D_1$ less than the reference voltage $V_{ref}$, the constant $K_1$ is negative. As a result, the output of integrator $A_1$ is held constant.

If $K_2 = K_3 = KE_c$, equation 3 becomes:

$$-\int e(t)dt = E_0 \cos KE_c t \qquad (4)$$

Where:
$KE_c = 2\pi f$
$E_0$ is amplitude of the output.

Then:

$$K_2\int(\int e(t)dt)dt = KE_c\int(\int e(t)dt)dt = E_0\sin KE_ct \qquad (5)$$

Equation 4 represents the output at terminal 16, and equation 5 represents the output at terminal 20. The results of equations 3, 4 and 5 depend on $K_2 \neq K_3$.

However, if $K_2 \ne K_3$, but both $K_2$ and $K_3$ are proportional to $E_c$, equation 5 becomes:

$$K_2 \int (\int e(t)dt)dt = \frac{E_o K_2}{\sqrt{K_2 K_3}} \sin \sqrt{K_2 K_3} E_c t \qquad (6)$$

Under the latter condition, the sine and cosine outputs maintain a constant ratio regardless of output frequency.

Differentiating equations 4 and 5 with time yields:
$$e(t) = KE_c E_o \sin KE_c t \qquad (7)$$
$$-K_2 \int e \, dt = KE_c E_o \cos KE_c t \qquad (8)$$

Equation 7 represents the output at output terminal 14, and equation 8 represents the output at output terminal 18, whose amplitudes are proportional to the control voltage and, hence, proportional to output frequency.

The circuit diagram of FIG. 2 is a more detailed circuit representation of the system of FIG. 1, except that a separate amplifier 24 is not used in the system of FIG. 2.

As shown in the detailed circuit diagram of FIG. 2, an operational amplifier 100 is interposed between the output of the analog multiplier $K_2$ and the output terminal 18. The amplifier 100 is shunted by a 100 pf capacitor C7 and by a 47 kilo-ohm resistor R21. The output of the amplifier 100 is also connected to the input of the integrator $A_2$ through an 8 kilo-ohm resistor R22. The other input terminal of the integrator $A_2$ is connected to a grounded 8 kilo-ohm resistor R23. The integrator $A_2$ is formed by shunting the corresponding operational amplifier by a 0.33 microfarad capacitor C8.

The output of integrator $A_2$ is connected to pin 10 of the analog multiplier $K_3$. Pin 3 is grounded; pin 1 is connected to a grounded resistor R20 of 16 kilo-ohms. Pins 2 and 4 are shunted by potentiometers R17, R18 and R19. Potentiometers R17 and R18 have a resistance of 20 kilo-ohms, and the potentiometer R19 has a resistance of 50 kilo-ohms. The movable contact of the potentiometer R17 is connected to pin 9 of the multiplier $K_3$, and the movable contact of potentiometer R18 is connected to pin 13. Pin 5 of the multiplier $K_3$ is connected to the negative terminal of a 15-volt source, and pin 15 is connected to the positive terminal of the source.

A 30 kilo-ohm resistor R16 is shunted across the pins 11 and 12, and a 62 kilo-ohm resistor R15 is shunted across the pins 7 and 8, of analog multiplier $K_3$. Pin 14 of the analog multiplier $K_3$ is connected to one input of an operational amplifier 102, and the movable contact of potentiometer R19 is connected to the other input. The amplifier 102 is shunted by a 47 kilo-ohm resistor R8 and by a 100 pf capacitor C4. The output of amplifier 102 is connected to output terminal 14.

The output of amplifier 102 is also connected to one input of integrator $A_1$ through an 8 kilo-ohm resistor R1. The output of analog multiplier $K_1$ is connected to this same input of integrator $A_1$. The other input of integrator $A_1$ is connected to an 8 kilo-ohm grounded resistor R2. Pin 5 of the muliplier $K_1$ is connected to the negative terminal of the 15-volt source, and pin 15 is connected to the positive terminal. A 30 kilo-ohm resistor R4 is connected across pins 11 and 12, and a 62 kilo-ohm resistor R3 is connected across pins 7 and 8. Pin 3 is grounded, and potentiometers R6 and R7 are connected across pins 2 and 4, each of the potentiometers having a resistance of 20 kilo-ohms. The movable contact of potentiometer R6 is connected to pin 6, and the movable contact of potentiometer R7 is connected to pin 13.

The integrator $A_1$ is formed by shunting a .33 microfarad capacitor C1 across the corresponding operational amplifier. The operational amplifiers forming integrators $A_1$ and $A_2$, and operational amplifiers 100 and 102 may be components of a guad operational amplifier of the type presently designated LM324. Pin 4 of the quad operational amplifier is connected through a diode CR3 to the positive terminal of the 15-volt source to reduce this voltage to approximately 13 volts. The diode may be of the type designated IN5179 which has three slicon diode junctions in series. The output of integrator $A_1$ is connected to the output terminal 16 and to the input pin 10 of analog multiplier $K_2$. The input terminal 10 is connected to pin 6 of analog multiplier $K_3$ and to pin 9 of analog multiplier $K_2$. Pin 3 of analog multiplier $K_2$ is grounded, and pin 1 is connected to a 16 kilo-ohm grounded resistor R14.

Potentiometers R11, R12 and R13 are connected across pins 2 and 4 of the analog multiplier $K_2$. Each potentiometer R11 and R12 has a resistance of 20 kilo-ohms, and potentiometer R13 has a resistance of 50 kilo-ohms. The movable contact of potentiometer R11 is connected to pin 6 of analog multiplier $K_2$, and the movable contact of potentiometer R12 is connected to pin 13. The movable contact of potentiometer R13 is connected to the other input of amplifier 100, which is a differential amplifier. Pin 5 of multiplier $K_2$ is connected to the negative terminal of the 15-volt source, and pin 15 is connected to the positive terminal. A 30 kilo-ohm resistor R10 is connected across pins 11 and 12, and a 62 kilo-ohm resistor R9 is connected across pins 7 and 8.

The output of integrator $A_1$ is connected to input pin 10 of analog multiplier $K_1$, and to a 15 microfarad coupling capacitor C2. The capacitor C2 is connected to the anode of a diode CR1 and to the cathode of a diode CR2. The diodes are included in a circuit forming the detector $D_1$. The circuit includes a resistor R24 connected to the cathode of the diode CR1 and to the anode of the diode CR2, and which has a resistance of 100 kilo-ohms. The resistor is shunted by a 15 microfarad capacitor C3 which, in turn, is shunted by a 10-volt Zener diode VR1 such as an IN758A. The resistor R5 (a 16 kilo-ohm resistor) is connected to pin 1 of multiplier $K_1$, and the cathode of diode CR1 is connected to pin 9 of multiplier $K_1$. The anode of the diode CR2, and the elements connected to the anode are all grounded. The Zener diode VR1 may be of the type presently designated IN758A, and the diodes CR1 and CR2 may be of the type presently designated IN914.

The circuit of FIG. 2 operates in the manner described above in the description of the diagram of FIG. 1, to achieve the desired results of the present invention.

The invention provides, therefore, an improved continuous wave oscillator circuit which is of a solid state construction, and which is capable of generating output sine waves in phase quadrature with one another, and of a frequency controlled by an input voltage. The output signals may have a constant amplitude, or they may have an amplitude which is a linear function of frequency.

It will be appreciated that although a particular embodiment of the invention has been described, modifications may be made. It is intended in the claims to cover the modifications which come within the true spirit and scope of the invention.

What is claimed is:

1. A voltage controlled oscillator for generating at least one sinusoidal output signal, said oscillator including: a first loop circuit including analog multiplier means and integrator means serially connected with one another; output terminal means connected to said loop circuit; and input terminal means connected to said analog multiplier meanns to control the multiplication factor of said analog multiplier means in accordance with the value of an applied control voltage so as to control the frequency of the output signal in a linear and continuous direct proportional relationship with the value of the applied control voltage, and in which said first loop circuit includes a first operational integrator and a second operational integrator, a first analog multiplier interposed between the first and second operational integrators, and a second analog multiplier interposed between the second and first operational integrators.

2. The voltage controlled oscillator defined in claim 1, and which includes first output terminal means connected to the output of the first operational integrator at which a first sinusoidal output signal appears of constant amplitude and of a frequency in direct proportional relationship with the value of the applied control voltage, and second output terminal means connected to the output of the second operational integrator at which a second sinusoidal output signal of constant amplitude appears phase-displaced 90° from the first output signal and of a frequency in direct proportional relationship with the value of the applied voltage.

3. The voltage controlled oscillator defined in claim 2, and which includes third output terminal means connected to the input of the first operational amplifier at which appears a third sinusoidal output signal of an amplitude and of a frequency in direct proportional relationship with the value of the applied control voltage, and a fourth output terminal means connected to the input of said second operational integrator at which a fourth sinusoidal output signal appears phase displaced 90° from the third output signal and of an amplitude and frequency in direct proportional relationship with the value of the applied voltage.

4. A voltage controlled oscillator including: a first loop circuit including analog multiplier means and integrator means serially connected with one another, said integrator means including a first operational integrator and a second operational integrator, and said analog multiplier means including a first analog multiplier interposed between the first and second operational integrators, and further including a second analog multiplier interposed between the second and first operational integrators; output terminal means connected to said loop circuit; input terminal means connected to said analog multiplier means to control the multiplication factor of said analog multiplier means in accordance with the value of an applied control voltage; and a second loop circuit including a third analog multiplier having an input connected to the output of the first operational integrator and having an output connected to the input of the first operational integrator.

5. The voltage controlled oscillator defined in claim 4, and which includes detector means connected to the output of the first operational integrator and to the third analog multiplier for maintaining the output of the third analog multiplier at an essentially constant amplitude level.

6. A voltage controlled oscillator for generating at least one sinusoidal output signal, said oscillator including: a first loop circuit including analog multiplier means and integrator means serially connected with one another; output terminal means connected to said loop circuit; and input terminal means connected to said analog multiplier means to control the multiplication factor of said analog multiplier means in accordance with the value of an applied control voltage so as to control the frequency of the output signal as a function of the value of the applied control voltage, in which said first loop circuit includes a first operational integrator and a second operational integrator, a first analog multiplier interposed between the first and second operational integrators, and a second analog multiplier interposed between the second and first operational integrators.

* * * * *